(12) United States Patent
Chang et al.

(10) Patent No.: US 6,670,672 B1
(45) Date of Patent: Dec. 30, 2003

(54) STRUCTURE OF DISCRETE NROM CELL

(75) Inventors: Kent Kuohua Chang, Taipei (TW);
Erh-Kun Lai, Taichung (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/175,839

(22) Filed: Jun. 21, 2002

(51) Int. Cl.[7] .............................................. H01L 29/792
(52) U.S. Cl. ...................... 257/324; 257/207; 257/325; 257/405; 257/510
(58) Field of Search ................................ 257/207, 324, 257/325, 405, 510

(56) References Cited

U.S. PATENT DOCUMENTS

| | | | | |
|---|---|---|---|---|
| 5,266,509 A | * | 11/1993 | Chen | 438/261 |
| 5,319,229 A | * | 6/1994 | Shimoji et al. | 257/324 |
| 5,357,134 A | * | 10/1994 | Shimoji | 257/325 |
| 6,127,696 A | * | 10/2000 | Sery et al. | 257/207 |
| 6,218,700 B1 | * | 4/2001 | Papadas | 257/324 |
| 6,477,084 B1 | * | 11/2002 | Eitan | 365/185.18 |
| 6,531,735 B1 | * | 3/2003 | Kamigaki et al. | 257/324 |
| 2003/0075773 A1 | * | 4/2003 | Demi et al. | 257/510 |

* cited by examiner

*Primary Examiner*—David Nelms
*Assistant Examiner*—Dao H. Nguyen
(74) *Attorney, Agent, or Firm*—Rabin & Berdo, PC

(57) ABSTRACT

A discrete NROM cell, at least comprising: a substrate; a first ON stacking gate and a second ON stacking gate over the substrate, wherein the ON stacking gate is a structure having a nitride layer over a bottom oxide layer; an oxide layer formed over the substrate covering the first and second ON stacking gate; a polysilicon layer formed over the oxide layer; and the source/drain implanted in the substrate and next to the ON stacking gates. The structure of discrete NROM cell of the invention can solve the problem of the electrons being trapped in the nitride layer of NROM cell, and also control the source/drain implant and ON structure at precisely symmetrical positions.

19 Claims, 7 Drawing Sheets

STRUCTURE OF DISCRETE NROM CELL

BACKGROUND OF THE INVENTION

1. Field of the Invention

The invention relates in general to a structure of nitride read-only memory (NROM) cells, and more particularly to the structure of discrete NROM cells fabricated according to the self-aligned process.

2. Description of the Related Art

The memory devices for non-volatile storage of information, such as read only memory (ROM), programmable read only memory (PROM), erasable programmable read only-memory (EPROM), and other advanced memory devices, are currently used in the worldwide industries. The other advanced memory devices that involve more complex processing and testing procedures include electrically erasable programmable read only memory (EEPROM), flash EEPROM, and nitride read-only memory (NROM). These advanced memory devices can accomplish the tasks that ROM can't do. For example, using EEPROM devices in circuitry permits in-circuit erasing and reprogramming of the device.

The main characteristic of NROM is dual bit cells having multiple threshold voltage levels, where every two threshold voltage levels together store a different bit. Others store one bit on either side of the cell. The conventional structures and fabricating methods of NROM cell are described in a lot of articles and references.

FIG. 1 is a cross-sectional view of a conventional NROM cell. The substrate 10 is implanted with a source 12 and a drain 14. On the top of substrate 10 lies an ONO structure, having a nitride layer 17 between a top oxide layer 16 and a bottom oxide layer (tunneling oxide layer) 18. A number of BD (buried diffusion) oxides 20 are formed to isolate the adjacent ONO structure and form the channels 22. The conventional structure of the NROM cell which contains dual bits in one cell is also depicted in FIG. 1. The larger region (encircled with the dashed line) denotes a NROM cell 30, and the two smaller regions encircled with the dashed line denote the first bit 32 and the second bit 34.

In the NROM cell, the nitride layer 17 provides the charge retention mechanism for programming the memory cell. Under normal condition, the electrons are introduced into the nitride layer 17 during programming of the cell, while the holes are introduced into the nitride layer 17 to neutralize or combine the electrons during erasing of the cell. However, nitride tends to trap electrons that are introduced in the nitride layer 17 due to its property. If the electrons are trapped in the nitride layer 17, the cell is under programming.

Additionally, according to the hot electron injection phenomenon, some hot electrons will penetrate through the bottom oxide layer 18, especially when it is thin, and are then collected in the nitride layer 17. A concentrated charge caused by the hot electrons significantly raises the threshold voltage of the portion of the channel 22 under charge to be higher than the threshold voltage of the remaining portion of the channel 22. When the cell is programmed, the concentrated charge is presented and the raised threshold voltage does not permit the cell to go to the conductive state. In a normal state, which the concentrated charge is not presented, the reading voltage over the channel can overcome the threshold voltage of the channel 22 and consequently the channel 22 is conductive.

Moreover, the conventional NROM cell is generally fabricated by photolithography, and has drawbacks. For example, the implant and the bits are not easily formed at the right position and could be shifted, so that the efficiency of the NROM cell is decreased.

SUMMARY OF THE INVENTION

It is therefore an object of the invention to provide a structure of discrete NROM cell, so that the symmetrical positions of the source/drain implant and ONO structure can be precisely controlled.

The invention achieves the above-identified objects by providing a discrete NROM cell, comprising: a substrate; a first ON stacking gate and a second ON stacking gate over the substrate, wherein the ON stacking gate is a structure having a nitride layer over a bottom oxide layer; an oxide layer formed over the substrate and covering the first and second ON stacking gates; a polysilicon layer formed over the oxide layer; and the source/drain implanted in the substrate and next to the ON stacking gates.

Other objects, features, and advantages of the invention will become apparent from the following detailed description of the preferred but non-limiting embodiments. The following description is made with reference to the accompanying drawings.

DETAILED DESCRIPTION OF THE INVENTION

The discrete NROM cell of the invention is fabricated by the self-aligned process. Two slightly different procedures are taken for illustration in the disclosed embodiments. Also, to avoid obscuring the invention, well-known elements not directly relevant to the invention are not shown or described. Accordingly, the specification and the drawings are to be as regarded in an illustrative sense rather than in a restrictive sense.

Method 1 for Fabricating NROM Cell

Figure 1:
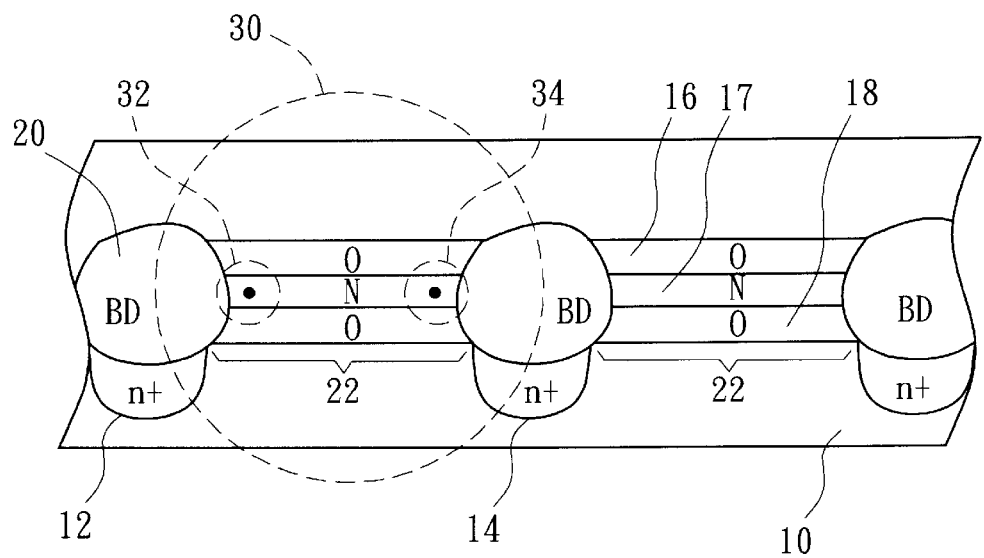
FIG. 1 (prior art) is a cross-sectional view of a conventional NROM cell.
Figure 2A:
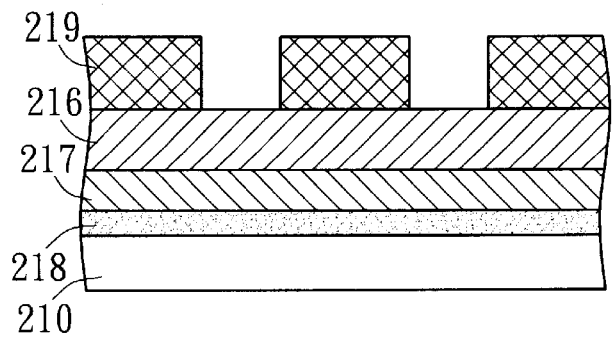
FIG. 2A~FIG. 2F illustrate the method of fabricating the discrete NROM cell by a self-aligned process according to the first embodiment of the invention.

FIG. 2A~FIG. 2F illustrate the method of fabricating the discrete NROM cell by self-aligned process according to the first embodiment of the invention. In FIG. 2A, a substrate 210 is provided and an ONO layer is formed thereon. The ONO layer includes a bottom oxide layer (tunneling oxide layer) 218 grown on the substrate 210, a nitride layer 217 deposited over the bottom oxide layer 218, and a top oxide layer 216 produced on the nitride layer 217. Then, a patterned photo-resist (PR) 219 is formed over the top oxide layer 216.

The thickness of the bottom oxide layer 218 typically ranges from 50 Å to 150 Å, and is preferably about 70 Å. The thickness of the nitride layer 217 typically ranges from 20 Å to 150 Å. The thickness of the top oxide layer 216 is not limited since it will be removed in the following procedures. However, it will be appreciated that the thickness of ONO layer are generally independent of each other, and variable depending on the field of the NROM cell application.

Figure 2B:
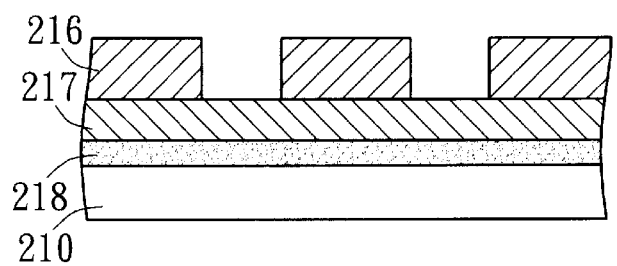

Next, the top oxide layer 216 is etched according to the patterned PR 219. The portion of the top oxide under the patterned PR 219 remains on while the portions not be covered are etched away. Then, the patterned PR 219 is removed as shown in FIG. 2B.

Figure 2C:
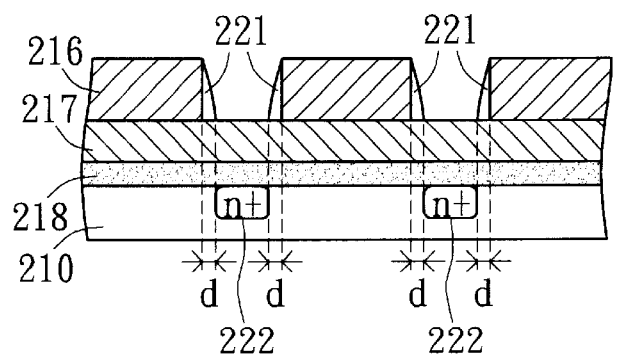

As illustrated by FIG. 2C, a film is then formed over the top oxide layer 216 and a portion of the nitride layer 217 by conformal deposition. Subsequently, the film is etched by an anisotropic etching process, and the spacers 221 are formed on the sides of the discrete top oxide layer 216. The film could be any material that can be differentiated from Nitride, such as oxide or polysilicon. Also, it is noted that the bottom width of the spacer 221 is controlled at a predetermined value (d).

Then, the source/drains 222 are implanted by a self-aligned process. The source/drain 222 is a concentration of N-type dopant such as phosphorous or arsenic ions, or P-type dopant such as boron or boron fluoride ions($BF_2^+$).

Figure 2D:
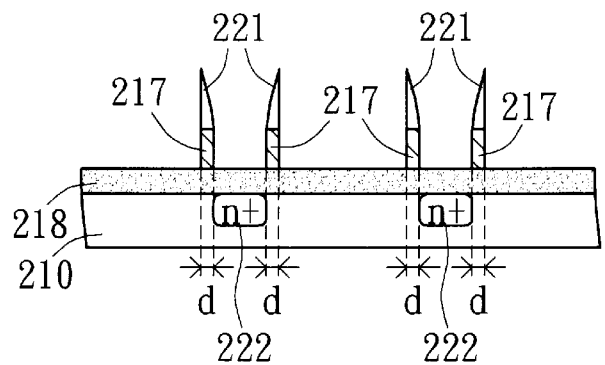
Figure 2E:
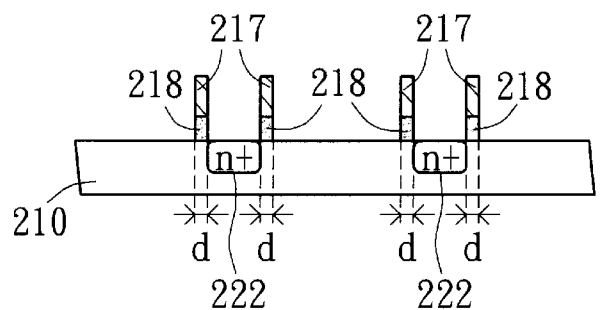

In FIG. 2D, the top oxide layer 216 and the nitride layer 217 are removed sequentially. The nitride sheltered by the spacers 221 remains on the bottom oxide while the other portions not covered are etched away. Then, the spacers 221 are removed. After that, the bottom oxide 218 is removed except under the remaining nitride 217, as shown in FIG. 2E.

Figure 2F:
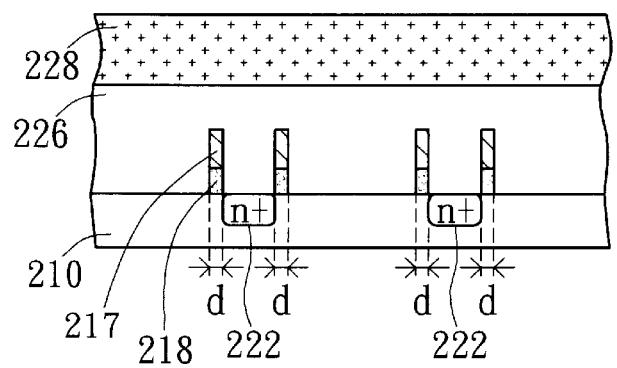

As described, the nitride layer 217 and the bottom oxide layer 218 have been etched and formed as a plurality of stacking gates. In FIG. 2F, an oxide layer 226 is formed over the substrate 210, so that the spaces between the discrete stacking gates are filled with the oxide; also, the ON stacking gates are fully covered.

Following oxide deposition, a polysilicon layer 228 is formed over the oxide layer 226 as a wordline. The polysilicon layer 228 can be amorphous silicon, or doped polysilicon that is doped by phosphorous or arsenic ions. Also, in this particular process, the Tungsten Silicide ($WSi_x$) is subsequently deposited over the polysilicon layer 228 (not shown in FIG. 2F). The discrete NROM cell is then finished.

Structure of NROM Cell in the First Embodiment

Figure 2G:
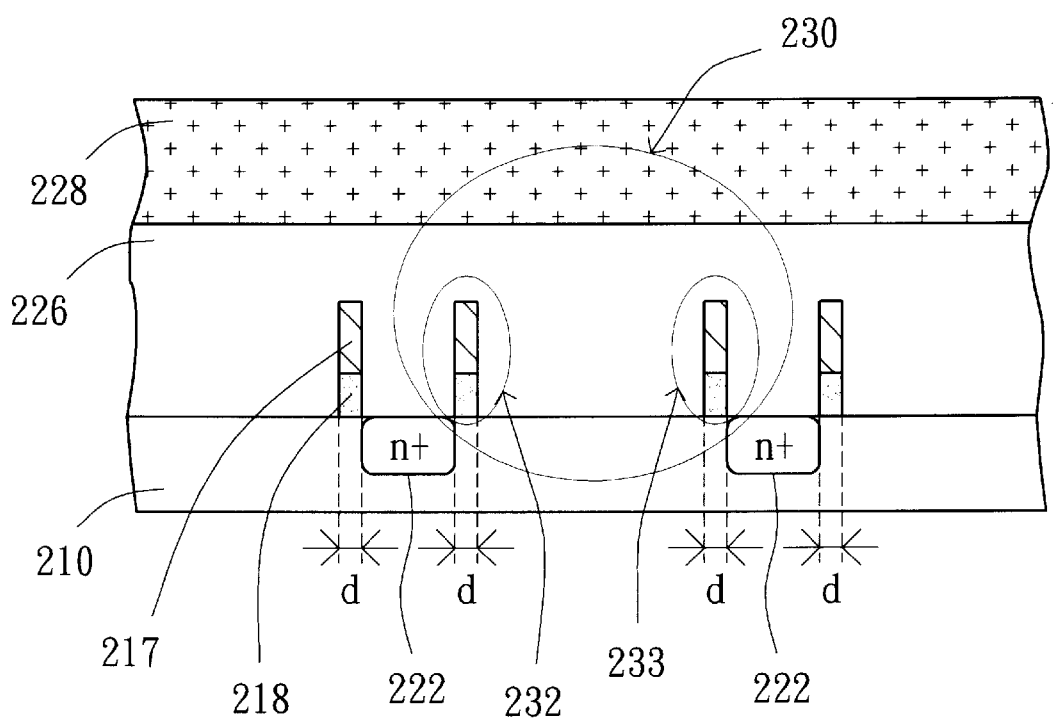
FIG. 2G is a cross-sectional view of the discrete NROM cell fabricated according to the first embodiment of the invention.

FIG. 2G is a cross-sectional view of the discrete NROM cell fabricated according to the first embodiment of the invention. The substrate 210 is implanted with the source/drain 222. The narrow ON stacking gate forming on the top of substrate 210 is formed from an ONO layer having the nitride layer 217 between the oxide layer 216 and the bottom oxide layer 218. Also, the ON stacking gates are separated from each other by the oxide layer 226; consequently, the discrete structure of the NROM cell is created. The oxide layer 226 is further capped by the polysilicon layer 228. The larger encircled region denotes a NROM cell 230, and the two smaller encircled regions denote the first bit 232 and the second bit 233. Two bits are controlled at a predetermined width (d). Also, the source/drain 222 is implanted by a self-aligned process and the following steps are also performed by self-aligned process. Therefore, the symmetrical position of the source/drain 222 and the ONO layer can be easily and precisely controlled. Further, the discrete ON stacking gates decrease the Possibility that electrons will be trapped in the nitride layer 217, so that the reliability of the NROM device is increased.

Method 2 for Fabricating NROM Cell

FIG. 3A~FIG. 3F illustrate the method of fabricating the discrete NROM cell by self-aligned process according to the second embodiment of the invention. The fabricating method of the second embodiment is mostly the same as that of the first embodiment, but some of the steps are slightly modified or changed in different orders.

Figure 3A:
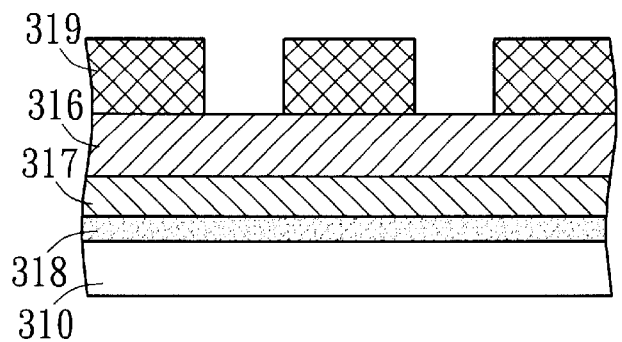
FIG. 3A~FIG. 3F illustrate the method of fabricating the discrete NROM cell by a self-aligned process according to the second embodiment of the invention.

The drawing of FIG. 3A is identical with FIG. 2A. In FIG. 3A, a substrate 310 is first provided and an ONO structure including a top oxide layer 316, a nitride layer 317, and a bottom oxide layer (tunneling oxide layer) 318 is formed thereon. Then, a patterned photo-resist (PR) 319 is formed over the top oxide layer 316. Similarly, the thickness of the three layers of the ONO structure are generally independent of each other, and variable depending on the field of NROM cell application.

Figure 3B:
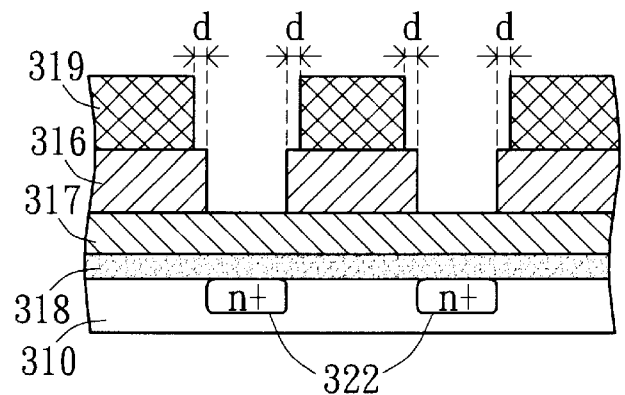

The top oxide layer 316 is etched according to the patterned PR 319. After that, the source/drain 322 are implanted by a self-aligned process. The source/drain 322 is typically boron (B) or $BF_2^+$. Then, the patterned PR 319 is de-scummed for exposing the portion of the top oxide layer 316 at the predetermined width of d, as illustrated in FIG. 3B.

Figure 3C:
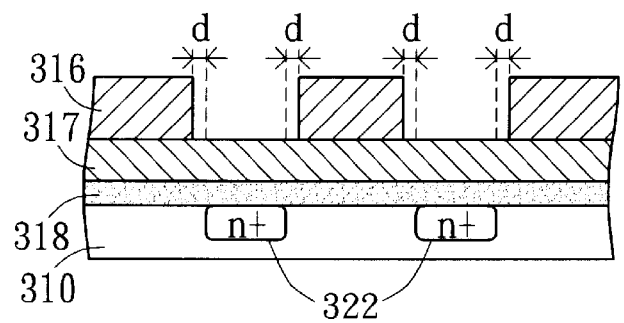

The top oxide layer 316 is then etched according to the PR descum, and followed by removing PR 319, as shown in FIG. 3C.

Figure 3D:
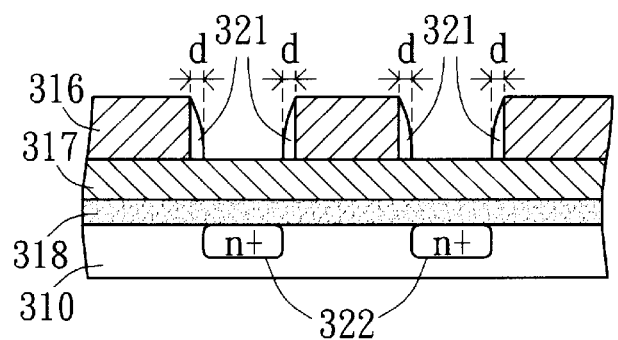

As illustration of FIG. 3D, a film is then formed over the top oxide layer 316 and the portion of the nitride layer 317 by conformal deposition. Subsequently, the film is etched by an anisotropic etching process, and the spacers 321 are formed on the sides of the discrete top oxide layer 316. The film could be any material that can be differentiated from Nitride, such as oxide or polysilicon. Also, it is noted that the bottom width of the spacer 321 is controlled at the predetermined value of d.

Figure 3E:
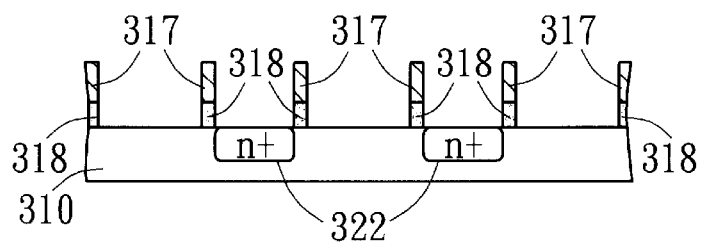

Next, the discrete top oxide layer 316 is removed. The nitride layer 317 is then etched according to the spacer 321. The nitride sheltered by the spacers 321 remains on the bottom oxide layer 318 while the other portion not covered by is etched away. The spacers 321 are then removed, as shown in FIG. 3E. Subsequently, the bottom oxide layer 318 is etched except under the remaining nitride layer 317, and a plurality of ON stacking gates are formed.

Then, an oxide layer 326 is formed over the substrate 310 and covers the ON stacking gates.

Figure 3F:
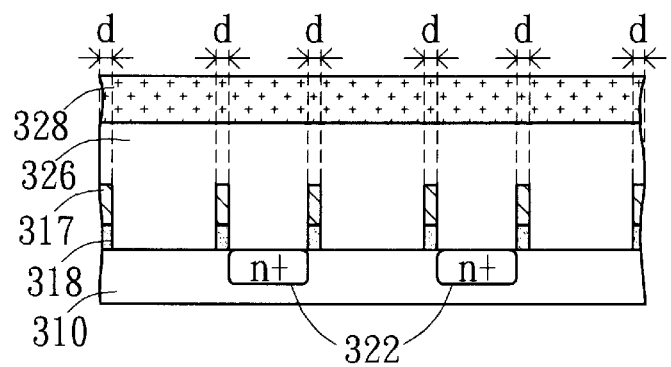

Then, the oxide layer 326 is capped with a polysilicon layer 328, as shown in FIG. 3F. The discrete NROM cell is then finished.

Structure of NROM Cell in the Second Embodiment

Figure 3G:
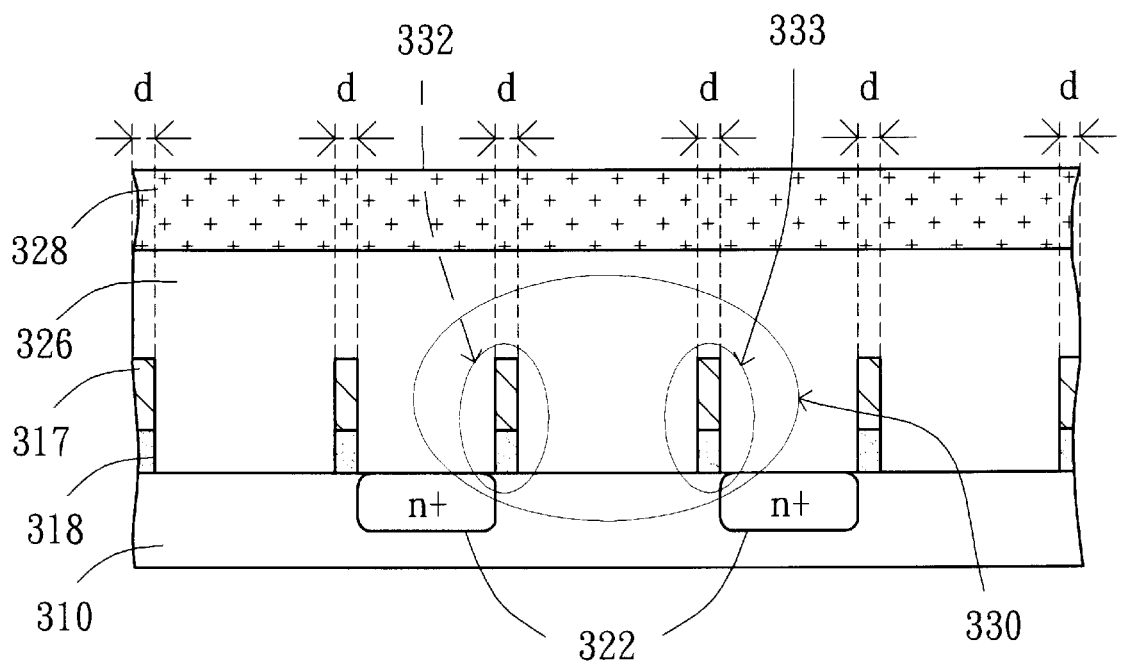
FIG. 3G is a cross-sectional view of the discrete NROM cell fabricated according to the second embodiment of the invention.

FIG. 3G is a cross-sectional view of the discrete NROM cell fabricated according to the second embodiment of the invention. The substrate 310 is implanted with the source/drain 322. Numerous narrow stacking gates formed on the top of substrate 310 are ON structures having the nitride layer 317 over the bottom oxide layer 318. Also, the ON stacking gates are separated from each other by the oxide layer 326; consequently, the discrete structure of NROM cell is created. The oxide layer 326 is further capped by the polysilicon layer 328. The larger encircled region denotes a NROM cell 330, and the two smaller encircled regions denote the first bit 332 and the second bit 333. Two bits are controlled at the predetermined width of d. Also, the source/drain 322 is implanted by self-aligned process and the following steps are also performed by self-aligned process. Therefore, the symmetrical position of the source/drain 322 and the ONO stacking gate can be easily and precisely controlled. Further, the discrete ON stacking gates decrease the possibility that electrons will be trapped in the nitride layer 317, thus increasing the reliability of the NROM device.

While the invention has been described by way of examples and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A discrete NROM cell, comprising:
    substrate;
    a plurality of discrete ON stacking gates formed over the substrate, wherein each ON stacking gate is a structure having a nitride layer over a bottom oxide layer;
    an oxide layer formed over the substrate and covering the ON stacking gates, and filling a space between the discrete ON stacking gates of the discrete NROM cell;
    a polysilicon layer formed over the oxide layer; and
    a plurality of source/drains respectively implanted in the substrate and next to the ON stacking gates.

2. The discrete NROM cell according to claim 1, wherein the thickness of the nitride layer ranges from about 20 Å to 150 Å.

3. The discrete NROM cell according to claim 1, wherein the thickness of the bottom oxide layer ranges from 50 Å to 150 Å.

4. The discrete NROM cell according to claim 3, wherein the bottom oxide layer is preferably about 70 Å.

5. The discrete NROM cell according to claim 1, wherein the polysilicon layer is doped by phosphorus or arsenic ions.

6. The discrete NROM cell according to claim 1, wherein the source/drain of NROM cell is a concentration of P-type dopant.

7. The discrete NROM cell according to claim 6, wherein the P-type dopant is Boron or $BF_2^+$.

8. The discrete NROM cell according to claim 1, wherein the source/drain of NROM cell is a concentration of N-type dopant.

9. The discrete NROM cell according to claim 8, wherein the N-type dopant is phosphorous or arsenic ions.

10. A discrete NROM cell, comprising:
    a substrate;
    a first ON stacking gate and a second ON stacking gate discretely formed over the substrate, wherein each ON stacking gate is a structure having a nitride layer over a bottom oxide layer;
    an oxide layer formed over the substrate and covering the first ON stacking gate and the second ON stacking gate, and filling a space between the discrete first and second ON stacking gates of the discrete NROM cell;
    a polysilicon layer formed over the oxide layer; and
    source/drains respectively implanted in the substrate and next to the first ON stacking gate and the second ON stacking gate.

11. The discrete NROM cell according to claim 10, wherein the polysilicon layer is doped by phosphorus or arsenic ions.

12. The discrete NROM cell according to claim 10, wherein a first bit and a second bit are in the virtual position of the first ON stacking gate and the second ON stacking gate, respectively.

13. The discrete NROM cell according to claim 10, wherein the thickness of the nitride layer ranges from about 20 Å to 150 Å.

14. The discrete NROM cell according to claim 10, wherein the thickness of the bottom oxide layer ranges from 50 Å to 150 Å.

15. The discrete NROM cell according to claim 10, wherein the source/drain of NROM cell is a concentration of P-type dopant.

16. The discrete NROM cell according to claim 15, wherein the P-type dopant is Boron or $BF_2^+$.

17. The discrete NROM cell according to claim 10, wherein the source/drain of the NROM cell is a concentration of N-type dopant.

18. The discrete NROM cell according to claim 17, wherein the N-type dopant is phosphorous or arsenic ions.

19. A single NROM cell, comprising:
    a substrate;
    a first ON stacking gate and a second ON stacking gate, each ON stacking gate being disposed over the substrate and each forming a respective bit, each ON stacking gate being a structure consisting essentially of a nitride layer disposed over a bottom oxide layer, the first ON stacking gate being separated from the second ON stacking gate by a space, with the substrate in a region of the space being free of a source/drain;
    an oxide layer formed over the substrate and covering the ON stacking gates, said oxide layer being in contact with the nitride layer and the bottom oxide layer of each stacking gate, and being in contact with the substrate in the region of the space so as to fill the space between the first and second stacking gate of the single NROM cell;
    a polysilicon layer formed over the oxide layer; and
    source/drains respectively implanted in the substrate and next to the first ON stacking gate and the second ON stacking gate.

* * * * *